United States Patent [19]

Kaiser et al.

[11] 3,919,602

[45] Nov. 11, 1975

[54] ELECTRIC CIRCUIT ARRANGEMENT AND METHOD OF MAKING THE SAME

[75] Inventors: Anton Kaiser; Helmut Keller, both of Reutlingen; Adolf Kugelmann, Leonberg, all of Germany

[73] Assignee: Robert Bosch G.m.b.H., Stuttgart, Germany

[22] Filed: Mar. 2, 1973

[21] Appl. No.: 337,742

[30] Foreign Application Priority Data

Mar. 23, 1972 Germany............................ 2214163
May 31, 1972 Germany............................ 2226395

[52] U.S. Cl........................... 317/101 C; 317/101 F
[51] Int. Cl.$^2$.......................................... H05K 5/60
[58] Field of Search...... 317/101 CC, 101 R, 101 C, 317/101 F; 174/68.5, 52 S, DIG. 3, 52 PE

[56] References Cited

UNITED STATES PATENTS

| | | | |
|---|---|---|---|
| 3,072,832 | 1/1963 | Kilby | 174/52 S |
| 3,381,071 | 4/1968 | Logan | 174/52 S |
| 3,381,081 | 4/1968 | Schalliol | 317/101 CC |
| 3,423,638 | 1/1969 | Dix et al. | 174/52 PE |
| 3,489,952 | 1/1970 | Hinchey | 317/100 |
| 3,495,133 | 2/1970 | Miller | 317/101 A |
| 3,549,782 | 12/1970 | Reifel | 317/101 A |
| 3,691,289 | 9/1972 | Rohloff | 174/DIG. 3 |

*Primary Examiner*—David Smith, Jr.
*Attorney, Agent, or Firm*—Michael S. Striker

[57] ABSTRACT

A circuit board of electrically insulating material is provided with a printed circuit including one or more circuit strips. A discrete electrical component, or several of them, is mounted on the circuit board in circuit with the circuit arrangement, and at least one semiconductor unit is provided on the circuit board and electrically connected with the circuit thereof.

24 Claims, 9 Drawing Figures

ELECTRIC CIRCUIT ARRANGEMENT AND METHOD OF MAKING THE SAME

BACKGROUND OF THE INVENTION

The present invention relates to electric circuit arrangements, and more particularly to electric circuit arrangements having at least one semi-conductor unit. it also relates to a method of making such circuit arrangements.

It is well known by now that electrical circuit arrangements may have semi-conductor units which accommodate a single semi-conductor or, using monolithic integrated circuitry, having two or more semiconductor elements. In either case, however, the prior art has always provided the semi-conductor units as well as the other electrical components associated with the circuit arrangement with separate housings, through which the connecting terminals extend to the exterior. The terminals themselves are then connected directly with the circuits of the printed circuit board on which the arrangement is provided, or indirectly via appropriate sockets.

Operationally these arrangements are fully suitable for use, but they are necessarily expensive to produce and therefore expensive to sell. A major reason for this is the fact that it was heretofore always thought necessary in the art to provide a special housing, especially for the semi-conductor unit or units, in order to protect the unit and in order to be able to use the housing as a heat sink. Evidently, the provision of such housings and the manner in which the semi-conductor units had to be mounted in the housings, whereupon the housings then had to be mounted on the circuit board, is a major contributing factor in the high expense of such arrangements according to the prior art.

SUMMARY OF THE INVENTION

It is, accordingly, a general object of the present invention to overcome the disadvantages of the prior art.

More particularly, it is an object of the present invention to provide an electric circuit arrangement which, according to the present invention, does not require housings for the semi-conductor unit or units and discrete electrical components which are also associated with the circuit arrangement.

Another object of the invention is to provide a method of making such a novel circuit arrangement.

In keeping with these objects, and with others which will become apparent hereafter, one feature of the invention resides, in an electrical circuit arrangement, in a combination, comprising a circuit board of electrically insulating material, and circuit means on the circuit board. The circuit means includes at least one circuit strip. At least one discrete electrical component is mounted on the circuit board in circuit with the circuit means. At least one semi-conductor unit is provided on the circuit board, and connecting means connects the semi-conductor unit with the circuit board.

By having the semi-conductor unit mounted directly on the circuit board, the necessity for a supporting housing is avoided. Moreover, it has been found that it is possible to protect the semi-conductor unit without a separate housing, if mounted in this manner, and that it is not necessary for a housing to be present and to act as a heat sink if the arrangement is in accordance with the present invention.

The semi-conductor unit has, in accordance with conventional practice, a plurality of terminals provided on its upper or exposed side, and these can be connected with the respectively associated circuit strips of the circuit means via so-called bond wires or via beam-lead connections. Bond wires and beam-lead connections are well known in this art and require no detailed discussion. it should, however, be pointed out that where ever the term "circuit strip" is used herein and in the appended claims with reference to the circuit means provided on the circuit board, it is not intended that such terminology should be limited to a particular strip-shaped configuration. In the printed circuit board art the term strip has become established for any kind of configuation of a portion of the circuit, so that it could be strip-shaped, it could be square, rectangular or have any other configuration. Also, the term "printed circuit" or "printed circuit board" as it may be used herein evidently is concerned with the generic type of circuit arrangement which is so designated in the art, not merely with a circuit arrangement in which the circuits are applied exclusively by printing onto the board.

By resorting to the present invention it is possible to produce an electric circuit arrangement whose manufacturing costs are considerably lower than those known from the prior art, and which at the same time is at least the equal in all respects of the circuit arrangements known from the prior art.

In the region where the semi-conductor unit or units will be provided, and of the electrical terminals thereof, the arrangement may be provided with a covering for protective purposes. The circuit board itself is advantageously of synthetic plastic material, for instance of glass fiber reinforced epoxy resin or of so-called hard paper. The circuit strips of the printed circuit are advantageously of copper and have a thickness which is greater than 20 micron. The manner in which the circuit strips can be produced is known from the art, that is the circuit board may be copper plated and subsequently masks may be employed for the removal by etching of those portions of the copper plating which are not necessary, leaving behind the printed circuit. However, other ways of producing the printed circuit are also known and can be employed.

To facilitate removal of the heat generated by the semi-conductor unit in operation, that is to act as a heat sink, the circuit strip on which the semi-conductor is mounted may have an area which is larger or much larger by comparison with the other circuit strips of the circuit. Evidently, heat will then be transmitted into the circuit strip and will be radiated from the same over the surface area thereof. In place of this, or in addition thereto, the circuit strip carrying the semi-conductor unit may also be provided with a layer of solder. if it is necessary to further improve the removal of heat, than the circuit board itself may be provided in its interior with an insert having good thermally conductive properties, for instance a metal mesh or the like. Still another manner of improving the removal of heat from the semi-conductor unit is to provide the circuit strip carrying the semi-conductor unit with at least one additional heat sink which is in thermally transmissive contact with it.

According to a further concept of the invention it is advantageous if the semi-conductor unit is mounted in the marginal region of a large-area circuit strip constituting a portion of the circuit, and to have other circuit strips extend from laterally to the region of this marginal portion, with the leads connecting the semi-conductor unit terminals with these other or additional circuit strips.

However, it is also possible to provide the circuit strip carrying the semi-conductor unit with a projection extending from one edge of the circuit strip, and to have the semi-conductor unit located on this projection. In that case the additional circuit strips with which the terminals of the semi-conductor unit are to be electrically connected can extend on the circuit board from three sides to the vicinity of this projection.

Another possibility is to have the circuit strip carrying the semi-conductor unit subdivided into two largearea main portions which are connected by a narrow neck-like portion on which latter the semi-conductor unit itself is mounted. The additional circuit strips to which the terminals of the semi-conductor unit are to be electrically connected, can then extend to this neck from opposite sides on the circuit board.

It has been further found to be particularly advantageous if the single or several discrete electrical components, which are part of the electric circuit arrangement in addition to the single or several semi-conductor units, are provided on one of the major surfaces of the circuit board, and to have the associated circuit strips with which the electrical components are to be connected provided on the opposite major surface of the circuit board. The circuit board in such a case will be provided with holes through which conductors or leads of the electrical components are passed and solder-connected at the other major surface with the respective circuit strips. The semi-conductor unit may be located at the major surface of the circuit board which is opposite that at which the electrical components are located, or it may be located on the same surface. if the semi-conductor unit is located at the opposite major surface then all of the circuit strips of the circuit means may be provided on this same surface, but on the other hand it is also possible to have some of these circuit strips located on one and others on the other major surface. In that case the semi-conductor unit would be located on that major surface at which the electrical components are also provided.

As already indicated, the invention is also concerned with a method for making the novel electric circuit arrangement. In keeping with the concept of the invention, this method involves the provision on the circuit board of the circuit means, and of holes extending through the circuit board. The semi-conductor unit will be provided at one surface of the circuit board and its terminals will be connected electrically to respective circuit strips. Thereupon the semi-conductor unit and its electrical terminals will be provided with a protective covering and then the discrete electrical component or components will be placed at the opposite major surface of the circuit board and there leads will be extended through respective one of the holes to be connected at that side at which the semi-conductor unit is located, with respective ones of the circuit strips of the circuit means, advantageously by passing the entire arrangement over a solder bath.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

Figure 1:
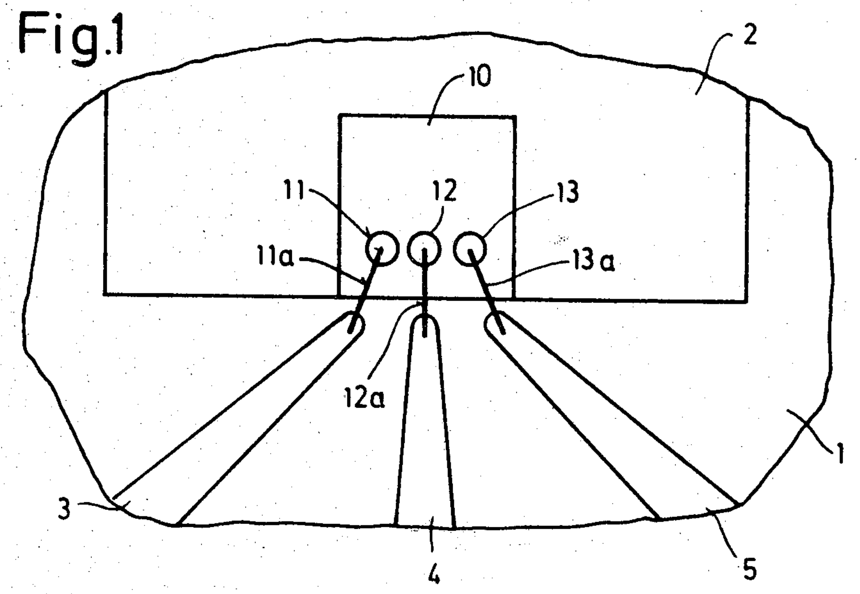
FIG. 1 is diagrammatic fragmentary top-plan view illustrating a first embodiment of an electric circuit arrangement according to the invention.
Figure 5:
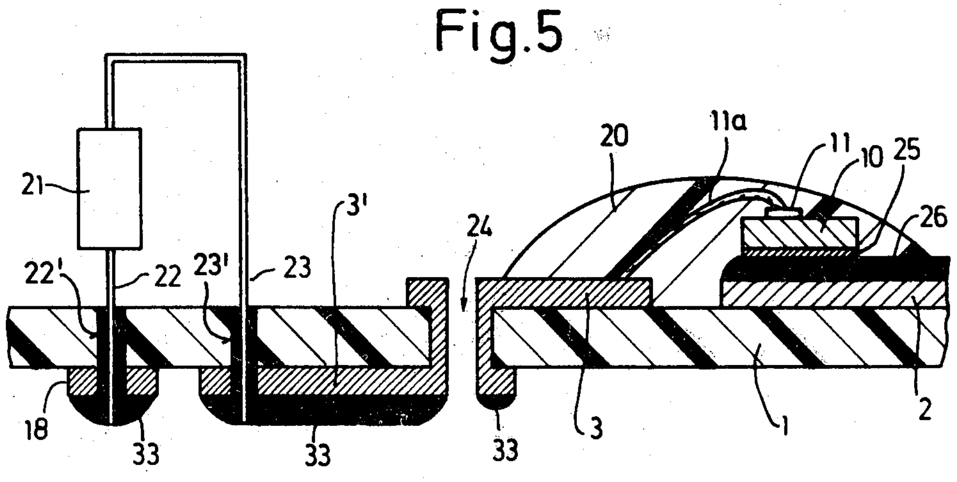
FIG. 5 is a view similar to FIG. 4 but illustrating a further embodiment of the invention.
Figure 6:
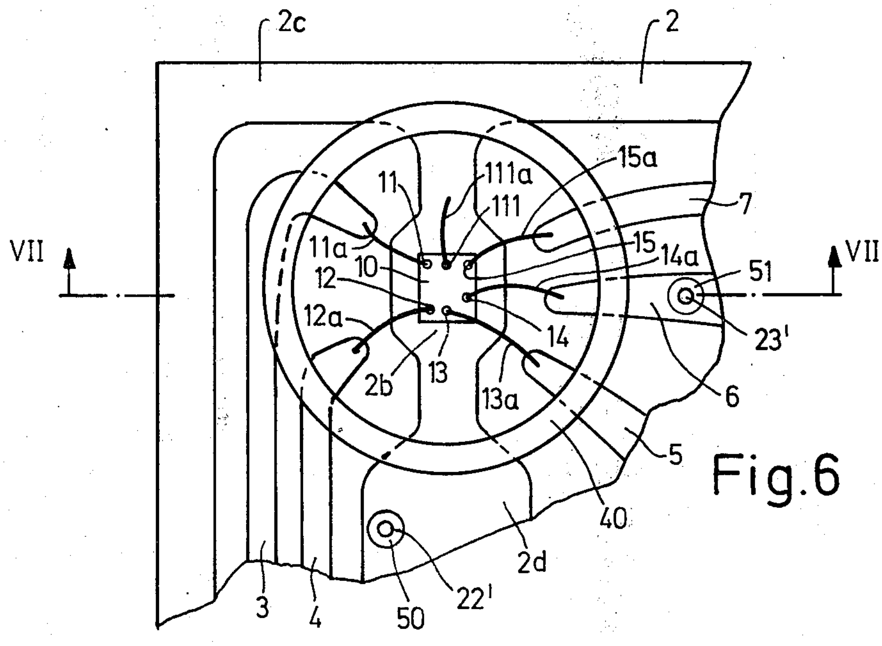
Figure 7:
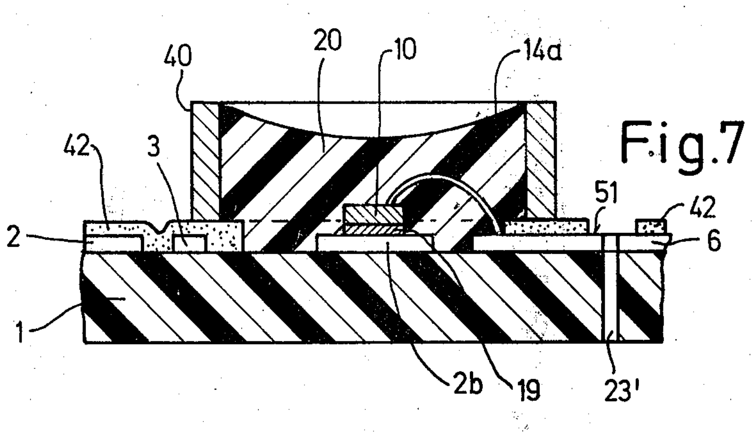

FIG. *5a* is a view similar to FIG. 5 but illustrating a sixth embodiment of the invention;

FIG. 6 is a view similar to FIG. 1 but illustrating a seventh embodiment of the invention;

FIG. 7 is a section taken line VII—VII of FIG. 6; and

Figure 8:
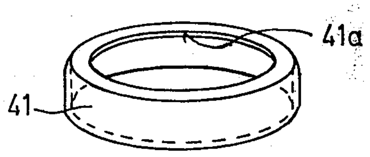

FIG. 8 is a perspective view of a detail of a component which is used in the embodiment of FIGS. 6 and 7.

DESCRIPTION OF THE PREFERRED EMBODIMENTS

Discussing the drawing in detail, and referring firstly to the embodiment illustrated in FIG. 1, it will be seen that the electric circuit arrangement which is shown in that FIGURE uses a circuit board 1 which is of an electrically insulating material, for instance synthetic plastic material or the like as previously discussed. The circuit board 1 is provided with electrical circuit strips 2, 3, 4 and 5 which together form a so-called printed circuit. The circuit board 1 is further the carrier of active and/or passive and/or electro-mechanical components, that is discrete electrical components which are connected in known manner to the respective circuit strips. Such components are shown in FIG. 4 and other FIGURES, but have been omitted in FIGS. 1–3 for the sake of clarity.

The circuit strip 2, which need of course not be strip-shaped, as has been previously pointed out, has bonded to its surface a semi-conductor unit 10 which in the illustrated embodiment contains a monolithically integrated circuit. Such monolithically integrated circuits using a plurality of semi-conductor units are already well known and require no detailed discussion. Of course, the semi-conductor unit 10 could also be in form of a single semi-conductor element.

In the embodiment of FIG. 1, the underside of the semi-conductor unit 10, that is the one facing the circuit strip 2, is not metallized but constitutes an electrode which is electrically conductively connected with the circuit strip 2 by means of an electrically conductive adhesive or bonding agent. Such bonding agents are well known in this field. However, it will be clear that the semi-conductor unit 10 could also be soldered to the circuit strip 2 in which case the underside of the semi-conductor unit 10 would, however, have to be metallized. Alternately, the underside of the unit 10 need not be configurated as an electrode in which case the unit 10 can be bonded to a circuit strip which does not carry electrical current, or if it is metallized it can be soldered to such a circuit strip. On the other hand, it is possible of course to bond the unit 10 with an electrically non-conductive bonding agent to a circuit strip which is current-carrying.

The upper side of the unit 10 is provided with three further electrodes which, contrary to the under side of the unit 10, are provided with metallic terminals 11, 12 and 13. In this embodiment, these terminals are connected via bond wires 11a, 12a and 13a with the additional circuit strips 3, 4 and 5, respectively. The bond wires 11a, 12a, 13a and the associated bonding points at the terminals 11, 12 and 13 of the semi-conductor unit 10 on the one hand, and at the ends of the circuit strips 3, 4 and 5 on the other hand, are hereafter also designated for short as the "electrical contacts" of the semi-conductor unit. It should be pointed out that in place of the bond wires it is also possible to use so-called beam-lead connections, which are for instance described in "Electronic Devices and Circuits", Millman and Shalkias, published by McGraw-Hill, pages 446–449.

In any case, the circuit strip 2 serves as a heat sink for heat which develops during operation of the semi-conductor unit. Because of this the surface area of the circuit strip 2 must be rather large to permit adequate radiation of heat therefrom. On the other hand, the distance of the semi-conductor unit 10 to the circuit strips 3, 4 and 5 must not be too large because this would make it difficult to affix the bond wires 11a, 12a and 13a. This problem is overcome in the embodiment of FIG. 1 by having the semi-conductor unit 10 located at a margin of the strip 2 and by having the strips 3, 4 and 5 extend from one lateral side towards the margin and the unit 10 as shown.

Figure 2:
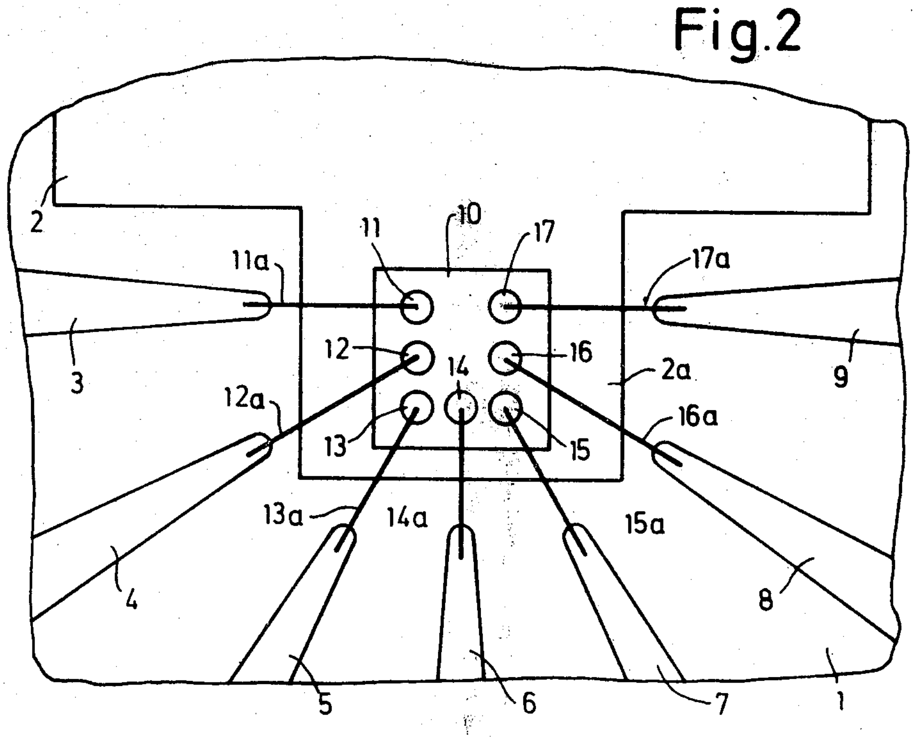
FIG. 2 is a view similar to FIG. 1 but illustrating a second embodiment.

The embodiment in FIG. 2 also utilizes a circuit board 1. This circuit board is not flexible and may in known manner be of phenolic or cured resin or another synthetic plastic resin. The board 1 is provided with electrical circuit strips 2, 3, 4, 5, 6, 7, 8 and 9. These circuit strips are connected with discrete electrical components which are not shown in FIG. 2, and the strip 2 is further provided with a semi-conductor unit 10 which also is in form of a monolithically integrated circuit. The unit 10 may be connected with the strip 2 electrically conductively or electrically non-conductively, depending upon whether the under-side of the unit 10 is constructed as an electrode or not.

The upper side of the unit 10 is provided with metallic contacts 11, 12, 13, 14, 15, 16 and 17, and these in turn are connected via bond wires **11*a*, 12*a*, 13*a*, 14*a*, 15*a*, 16*a* and 17*a* with the circuit strips 3, 4, 5, 6, 7, 8 and 9. In this embodiment, as in FIG. 1, the bond wires can be replaced by beam-lead connectors. To facilitate the affixing of the bond wires, the semi-conductor unit 10 is provided on a laterally extending projecting portion of the circuit strip 2, this portion being designated with reference numeral 2*a*, and the strips 3–9 extend from three lateral sides close to this portion 2*a***.

Figure 3:
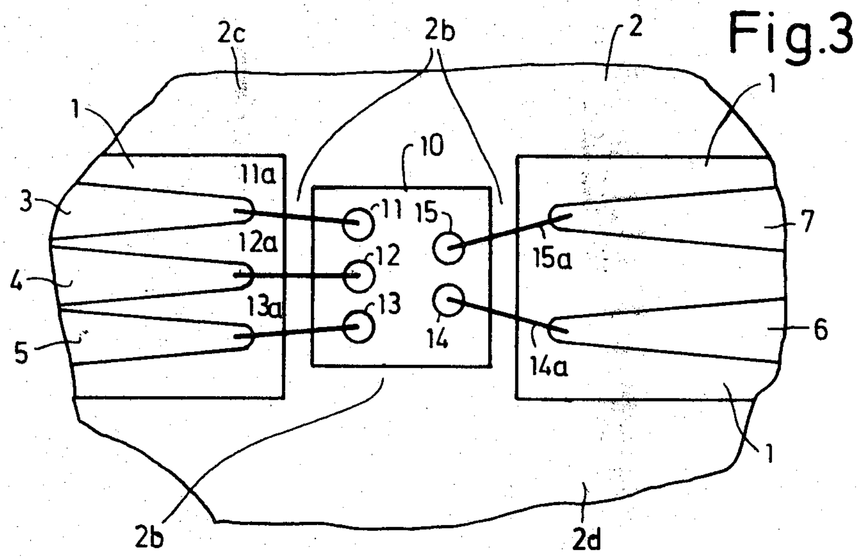
FIG. 3 is a view similar to FIG. 2 but illustrating a third embodiment.
Figure 4:
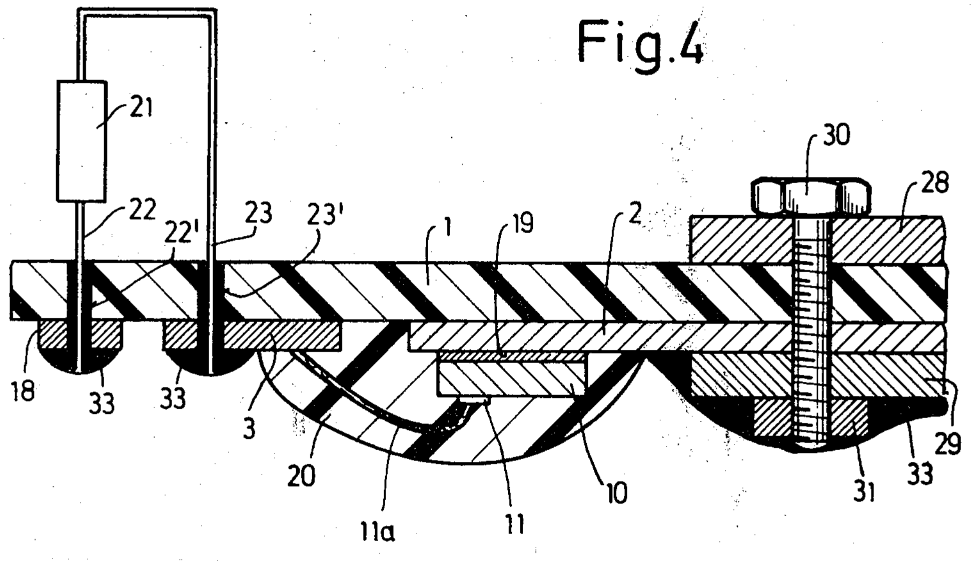
FIG. 4 is a fragmentary cross section on an enlarged scale, through a fourth embodiment of the invention.

FIG. 3 shows a further embodiment in the invention where again a circuit board 1 is provided, having a large-area circuit strip 2. In this embodiment the circuit strip 2 is actually composed of two main portions **2*c* and 2*d* which are connected by a narrow bridge portion 2*b* on which the semi-conductor unit 10 is provided. The circuit strips 3, 4, 5, 6 and 7 are provided on the circuit board 1 and extend from two sides laterally to the vicinity of the portion 2*b*. They are connected via bond wires 11*a*–15*a* with the metallic terminals 11–15 at the upper side of the semi-conductor unit 10**, as illustrated.

Reference to FIG. 4 will show how a circuit arrangement according to the invention may appear in cross section. The circuit board is designated with reference numeral 1 and it will be seen that in this instance it is provided with circuit strips 2, 3 and 18 which are provided on what is normally the underside of the circuit board 1. The semi-conductor unit 10 is bonded to the circuit strip 2, electrically conductively or else non-conductively, and the layer of bonding material used for this purpose is designated with reference numeral 19. The side of the unit 10 which faces away from the circuit strip 2 is provided with a metallic contact or terminal 11 which is electrically conductively connected with the circuit strip 3 via a bond wire **11*a***. Of course, additional terminals and associated bond wires may be provided.

The semi-conductor unit 10 and its electrical contacts are protected by a protective covering 20 which may be provided by a lacquering process, by dripping it on or by applying it in a surge-deposition method, after the bond wire 11a is secured. The covering 20 may be of synthetic resin, of silicone rubber or other suitable material.

The upper side of the circuit board 1 is provided with a plurality of discrete electrical components. FIG. 1 shows only one of these by way of example, namely a resistor 21 which has electrical leads 22 and 23. The resistor is connected via the lead 22 with the circuit strip 18, and via the lead 23 with the circuit strip 3 in electrically conductive relationship. To make this possible, the circuit board 1 is provided in the region of the circuit strips 18 and 3 with respective holes 22' and 23' which extend also through the circuit strips 18 and 3 and through which the leads 22 and 23 are passed to be subsequently soldered to the strips 18 and 3 by a surge-deposition soldering method. The liquid solder which is applied from below by this surge-deposition method wets and contacts any of those portions of the circuit strips 18 and 3 which are not provided with a covering 20.

In addition, the embodiment of FIG. 3 is provided with two heat sinks 28 and 29 which are diagrammatically illustrated and which are connected with the circuit strip 2 with the aid of a screw 30 and a nut 31 in good thermally conductive relationship. These heat sinks serve to aid the heat radiation of the circuit strip 2 for removing heat from the semi-conductor unit 10. It will be appreciated that the heat sinks 28 and 29 may but need not be housings of discrete electrical components if so desired. When the liquid solder is provided to contact the underside of the circuit arrangement shown in FIG. 4, all metallic components at the underside are contacted and wetted with the solder so that solder layers 33 will form.

A further embodiment, somewhat different from that of FIG. 4, is illustrated in FIG. 5 where the semi-conductor unit 10 is provided not at the underside of the circuit board 1 but on the upper side thereof together with the resistor 21. To make this possible the circuit strips 2 and 3 are also located at the upper side of the circuit board 1, whereas the circuit strip 18 is provided on the underside thereof. The circuit stip 3 has an extension 3' at the underside of the circuit board 1, and the extension 3' is connected with the strip 3 via a so-called land 24. Here also the semi-conductor unit 10 and its terminals are provided with a protective covering 20 which, contrary to the embodiment of FIG. 4, is not required at the time the leads 22 and 23 of the resistor 21 are fixed, because at that time it is not necessary to protect the semi-conductor unit 10 by means of the covering 20, due to the fact that the unit 10 is located at the upper side of the board 1. Hence the covering 20 need be provided only for protecting the unit 10 and its terminals during the later use and operation of the circuit arrangement and can therefore be applied subsequently. It is also to be noted that contrary to FIG. 4 the unit 10 is not adhered to the strip 2, but is soldered to it for which reason it is provided on its under side facing the strip 2 with a metallized layer 25. The solder layer 26 covers the entire upper surface of the strip 2 and not only serves for soldering purposes but also to improve the removal of heat from the semi-conductor unit, that is to improve the radiation of heat from the circuit strip 2 into which the heat has entered from the unit 10.

Figure 5A:
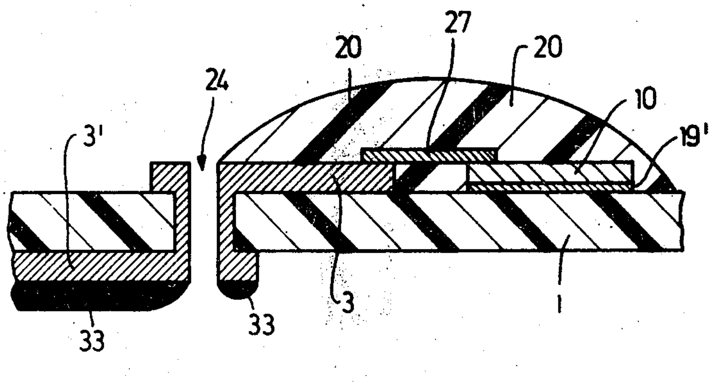

In the embodiment of FIG. 5a the components shown in FIG. 5 at the left-hand side thereof and designated with reference numerals 18, 21, 22 and 23 are also to be understood as being present; for this reason they have not been separately illustrated. Unlike FIG. 5, however, the embodiment of FIG. 5a has the semi-conductor unit 10 directly adhered by means of an adhesive layer 19′ to the circuit board 1; thus, an electrically conductive connection of the underside of the unit 10 with any of the circuit strips is impossible in this embodiment. The bonding wire 11*a* of FIG. 5 is replaced in FIG. 5*a* by a beam-lead connector 27. As in FIG. 5, the unit 10 and the beam-lead connector 27 replacing the bonding wire 11a are protected by a covering 20 against external influences and damage thereto.

FIGS. 6 and 7 illustrate a further embodiment in which the circuit board is again designated with reference numeral 1, being provided with electrical circuit strips 2–7. The strip 2 is of larger surface area than the other strips and has bonded to it by means of a bonding layer 19 the semiconductor unit 10. In this embodiment the strip 2 is composed of two major portions 2*c* and 2*d* which are connected by a narrow neck-like connecting portion 2*b* on which the unit 10 is secured. The upper side of the unit 10 is provided with metallic terminals 111, 11, 12, 13, 14 and 15. These are connected with the circuit strips 2–7 via bond wires 111*a*, 11*a*, 12*a*, 13*a*, 14*a* and 15*a* respectively. The bond wires and the associated bonding points at the terminals of the unit 10 on the one hand, and at the ends of the strips 2–7 on the other hand, are hereafter also designated as the electrical contacts of the unit 10.

The circuit board 1 is provided with circuit holes 22′ and 23′ in the region of the strips 2 and 6, and these holes extend not only through the board 1 but also through the strips 2 and 6, respectively. As in the embodiments of FIGS. 4 and 5 these holes 22′ and 23′ serve to pass therethrough the leads of discrete electrical components, for instance the leads 22 and 23 of the resistor 21 shown in FIGS. 4 and 5 which has been omitted in FIGS. 6 and 7 for clarity. The soldering is again effected in known manner, for instance by means of the surge-deposition method.

The covering 20 is provided in this embodiment also, covering the unit 10 and its electrical contacts. It may be of synthetic plastic resin, of silicone rubber or of other suitable material and in order to prevent it from running off before it has had a chance to harden, an annulus 40 may be provided which is placed about the semi-conductor unit 10 and its electrical contacts before the material which is to form the covering 20 is placed on top of them.

It is desirable that the liquid solder which is applied by surge-deposition contact only those portions of the circuit strips which are required for soldering the electrical leads of the discrete electrical components, for instance the leads 22 and 23. To assure this the circuit board 1 having the strips 2–7 is provided with a protective layer 42 of solderstop lacquer which in the region of the circuit holes 22′ and 23′ leaves circular areas 50 and 51 free which serve as soldering eyes; the layer 42 is applied before the semi-conductor unit 10 is affixed to the circuit board. In addition to the areas 50 and 51, the layer 42 leaves free a larger area, which may for instance be circular, surrounding the point at which subsequently the semi-conductor unit 10 and its electrical terminals are to be affixed. The diameter of this circular area may be smaller than the internal diameter of the annulus 40 so that this ring will circumferentially contact the protective layer 42. The ring 40 may be of insulating material or of metallic material, or it may be represented by a combination of metallic and insulating material, for instance anodized aluminum.

FIG. 8 shows that ring 40 could be replaced by a cap 41 which is provided at the side facing away from the semi-conductor unit 10 which an opening 41*a* through which the liquid material, which is subsequently during hardening to form the protective covering 20, can be poured. Of course, the opening 41*a* must be large enough to permit this.

The ring 40 or the cap 41 may also be brought into heat exchange contact with a heat sink, for instance via the large-area circuit strip 2 to which in turn the heat sinks 28, 29 in FIG. 4 may be affixed.

The annular elements 40 and 41 of course make it possible, especially if materials of low viscosity are used for making the covering 20, to obtain relatively high thickness for the layer of protective covering. Moreover, the elements 40 and 41 can be so configurated that they provide an additional mechanical protection for the semi-conductor unit 10, protecting the same against contact. This is particularly advantageous if the covering 20 never really becomes hard, but remains relatively soft. Such a protection is further enhanced by the development of a meniscus, which forms in the case of wetting material for the covering 20, if the elements 40 and 41 are only partially filled and, being recessed as shown, provides a further protection against inadvertent contact.

When the discrete electrical components are to be solder-connected to the associated circuit strips by means of the surge-deposition method, the annular arrangements 40 and 41, particularly in connection with the formation of the aforementioned meniscus at the upper side of the covering 20, constitute an effective means for increasing the thermal time constant from solder surge-bath to the semi-conductor unit 10.

The thermal time constant from the solder surge-bath to the semi-conductor unit 10 is further improved by the protective layer 42 which, in addition, serves to prevent oxidation or corrosion during the manufacture and enhances the shelf-life of the completed unit. The protective layer 42 can be made not only of solder-stop lacquer, but also of other protective lacquers and can be replaced, if desired, by a metallized layer of nickel, silver, gold or other metals which in this case need be provided only on the circuit strips 2–7.

It will be appreciated that with the construction according to the present invention an electric circuit arrangement is provided, and a method of making it, which avoids the earlier outlined disadvantages of the prior art and can be produced in a much less expensive manner than what is known from the art. Hence, the objects of the present invention have been achieved.

It will be understood that each of the elements described above, or two or more together, may also find a useful application in other types of constructions differing from the type described above.

While the invention has been illustrated and described as embodied in an electric circuit arrangement, it is not intended to be limited to the details shown, since various modifications and circuit changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

We claim:

1. In an electric circuit arrangement, a combination comprising a circuit board of electrically insulating synthetic plastic material having two major surfaces and provided with a plurality of holes passing through said circuit board from one to the other of said surfaces; circuit means on said one surface of said circuit board and including a plurality of electrically conducting circuit strips of copper each having a thickness greater than 20 $\mu$; anti-solder lacquer applied to selected regions of at least said one surface of said circuit board and of said circuit means; at least one semi-conductor unit having a surface provided with a plurality of terminals; means for connecting said semi-conductor unit with said circuit board at said one surface thereof so that said terminals are exposed; flexible conductor means for electrically connecting the respective ones of said terminals to the respective ones of said circuit strips and forming loops having apexes spaced at most a predetermined distance from said one surface of said circuit board; a hollow cylindrical element connected to said one surface of said circuit board so as to surround at least said semi-conductor unit and said conductor means and having a height exceeding said distance for protecting said semi-conductor unit and said conductor means from mechanical damage; protective potting means in said cylindrical element over said semi-conductor unit and said conductor means and including a body of polymerizable material having a height exceeding said distance but smaller than said height of said cylindrical element so that the latter bounds with said body a depression; at least one discrete electrical component provided with electrical input and output leads and arranged adjacent said other surface of said circuit board, said leads of said electrical component passing through said holes and having respective free ends at said one surface of said circuit board outside of said selected regions; and solder means applied to said one surface of said circuit board and operative for connecting said leads to the associated ones of said circuit strips, said anti-solder lacquer and an air cushion in said depression protecting said selected regions and said semi-conductor unit with said conductor means, respectively, from said solder means during the application thereof to said one surface of said circuit board.

2. A combination as defined in claim 1, wherein said connecting means comprises an adhesive substance adhering said semi-conductor unit to said circuit board directly.

3. A combination as defined in claim 1, wherein said connecting means comprises an adhesive substance adhering said semi-conductor unit to said circuit strips.

4. A combination as defined in claim 1, wherein said connecting means comprises a solder substance connecting said semi-conductor unit to said circuit strips.

5. A combination as defined in claim 1, wherein said conductive means comprises band wires.

6. A combination as defined in claim 1, wherein said cylindrical element is a cap covering said conductor means and having an opening.

7. A combination as defined in claim 6, wherein said cap has a transverse wall opposite said semi-conductor unit, and wherein said opening is provided in said transverse wall.

8. A combination as defined in claim 1, wherein said cylindrical elements is of metallic material.

9. A combination as defined in claim 1, wherein said cylindrical element is of electrically insulating material.

10. A combination as defined in claim 1, wherein said cylindrical element is composed in part of metallic material and in part of electrically insulating material.

11. A combination as defined in claim 10, wherein said metallic material is oxydized aluminum.

12. A combination as defined in claim 1; and further comprising at least one heat sink in thermally conductive relationship with said surround means.

13. A combination as defined in claim 1; and further comprising a corrosion-resistant metallic protective layer covering at least portions of said circuit means.

14. A combination as defined in claim 13, wherein said protective layer is a nickel coating.

15. A combination as defined in claim 13, wherein said protective layer is a silver coating.

16. A combination as defined in claim 2, wherein said protective layer is a gold coating.

17. A combination as defined in claim 1, wherein said connecting means connects said semi-conductor unit to one of said circuit strips; and wherein the area of said one circuit strip is larger than the areas of the other of said circuit strips.

18. A combination as defined in claim 1, wherein wherein said connecting means is a layer of solder provided on one of said circuit strips and connecting said semi-conductor unit to said one circuit strip.

19. A combination as defined in claim 1, wherein said circuit board contains at least one insert of a material having good thermal conductivity.

20. A combination as defined in claim 19, wherein said insert is a metallic mesh.

21. A combination as defined in claim 1, wherein said connecting means connects said semi-conductor unit with one strip said circuit strips; and further comprising at least one heat sink in thermally conductive relationship with said circuit strip.

22. A combination as defined in claim 1, wherein said connecting means connects said semi-conductor unit to one of said circuit strips in the region of one margin thereof; and wherein the remaining circuit strips extend on said circuit board laterally of and into the vicinity of said one circuit strip.

23. A combination as defined in claim 1, wherein one of said circuit strips comprises a main portion and a projecting portion extending laterally from said main portion, said semi-conductor unit being provided on said projecting portion; and wherein the remaining circuit strips extend on said circuit board from three sides toward the region of said projecting portion.

24. A combination as defined in claim 1, one of said circuit strips comprising two spaced-apart main portions and a narrow connecting portion connecting said main portions, said semi-conductor unit being provided on said connecting portion; and wherein the remaining circuit strips extend on said circuit board from two sides toward the region of said connecting portion.

* * * * *